United States Patent
Lin et al.

(10) Patent No.: US 12,300,633 B2
(45) Date of Patent: *May 13, 2025

(54) WARPAGE-REDUCING SEMICONDUCTOR STRUCTURE AND FABRICATING METHOD OF THE SAME

(71) Applicant: UNITED MICROELECTRONICS CORP., Hsin-Chu (TW)

(72) Inventors: Da-Jun Lin, Kaohsiung (TW); Chin-Chia Yang, Tainan (TW); Tai-Cheng Hou, Tainan (TW); Fu-Yu Tsai, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/660,179

(22) Filed: May 9, 2024

(65) Prior Publication Data

US 2024/0290731 A1 Aug. 29, 2024

Related U.S. Application Data

(63) Continuation of application No. 17/369,936, filed on Jul. 7, 2021, now Pat. No. 12,014,995.

(30) Foreign Application Priority Data

Jun. 7, 2021 (CN) .......................... 202110630599.7

(51) Int. Cl.
*H01L 23/00* (2006.01)
*H01L 21/02* (2006.01)
*H01L 23/522* (2006.01)
*H10D 64/23* (2025.01)

(52) U.S. Cl.
CPC ...... *H01L 23/562* (2013.01); *H01L 21/02164* (2013.01); *H01L 21/0217* (2013.01); *H01L 21/02348* (2013.01); *H01L 23/5226* (2013.01); *H10D 64/251* (2025.01)

(58) Field of Classification Search
CPC ............. H01L 23/562; H01L 21/02164; H01L 21/0217; H01L 21/02348; H01L 23/5226; H01L 29/41725
See application file for complete search history.

(56) References Cited

U.S. PATENT DOCUMENTS

| | | | |
|---|---|---|---|
| 10,818,611 B2 | 10/2020 | Chang | |
| 12,014,995 B2 * | 6/2024 | Lin | H01L 21/02164 |
| 2016/0307862 A1 * | 10/2016 | Lin | H01L 24/20 |
| 2017/0117320 A1 * | 4/2017 | Matsugai | H10F 39/026 |
| 2022/0052099 A1 | 2/2022 | Ito | |
| 2022/0262631 A1 * | 8/2022 | Itoh | C23C 16/511 |

* cited by examiner

*Primary Examiner* — Monica D Harrison
*Assistant Examiner* — Andre C Stevenson
(74) *Attorney, Agent, or Firm* — Winston Hsu

(57) ABSTRACT

A warpage-reducing semiconductor structure includes a wafer. The wafer includes a front side and a back side. Numerous semiconductor elements are disposed at the front side. A silicon oxide layer is disposed at the back side. A UV-transparent silicon nitride layer covers and contacts the silicon oxide layer. The refractive index of the UV-transparent silicon nitride layer is between 1.55 and 2.10.

20 Claims, 4 Drawing Sheets

WARPAGE-REDUCING SEMICONDUCTOR STRUCTURE AND FABRICATING METHOD OF THE SAME

CROSS REFERENCE TO RELATED APPLICATIONS

This application is a continuation application of U.S. application Ser. No. 17/369,936, filed on Jul. 7, 2021. The content of the application is incorporated herein by reference.

BACKGROUND OF THE INVENTION

1. Field of the Invention

The present invention relates to a warpage-reducing semiconductor structure and a method of fabricating the same, and more particularly to a semiconductor structure and a method which use oxide materials to prevent a semiconductor structure from warpage.

2. Description of the Prior Art

Generally speaking, the fabrication of semiconductor devices includes forming multiple material layers on a semiconductor wafer and patterning these material layers to manufacture semiconductor devices. When a material layer is formed on the surface of the semiconductor wafer, each material layer applies different tensile or compressive stresses to the semiconductor wafer. Based on the design of the products, different material layers can be formed on the front side or the back side of the semiconductor wafer. Moreover, the same material layer with different thicknesses can be formed on the front side or the back side of the semiconductor wafer. In this way, stresses on the front side and back side become unbalanced.

However, when the stresses on the front side and the back sides of the semiconductor wafer are unbalanced, warpage may occur on the semiconductor wafer. That is, the semiconductor wafer bends toward the front side or the back side. In addition, because of different thermal expansion coefficients of the material layers, different stresses on the front side and back side are generated when temperature changes.

When the warpage exceeds a certain level, problems occur during a wafer-to-wafer bonding or a chip-stacking process.

SUMMARY OF THE INVENTION

According to a preferred embodiment of the present invention, a warpage-reducing semiconductor structure includes a wafer having a front side and a back side. Numerous semiconductor elements are disposed at the front side. A silicon oxide layer is disposed at the back side. A UV-transparent silicon nitride layer covers and contacts the silicon oxide layer, wherein the refractive index of the UV-transparent silicon nitride layer is between 1.55 and 2.10.

According to another preferred embodiment of the present invention, a fabricating method of a warpage-reducing semiconductor structure includes providing a wafer including a front side and a back side, wherein numerous semiconductor elements disposed at the front side. Next, a silicon oxide layer is formed to dispose at the back side. Then, a silicon nitride layer is formed to cover and contact the silicon oxide layer. Finally, a UV light curing process is performed. During the UV light curing process, the UV light penetrates the silicon nitride layer to irradiate the silicon oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a fabricating method of a warpage-reducing semiconductor structure according to a first preferred embodiment of the present invention, wherein:
   FIG. 2 is a fabricating stage following FIG. 1;
   FIG. 3 is a fabricating stage following FIG. 2; and
   FIG. 4 is a fabricating stage following FIG. 3.
FIG. 5 to FIG. 8 depict a fabricating method of a warpage-reducing semiconductor structure according to a second preferred embodiment of the present invention, wherein:
   FIG. 6 is a fabricating stage following FIG. 5;
   FIG. 7 is a fabricating stage following FIG. 6; and
   FIG. 8 is a fabricating stage following FIG. 7.

DETAILED DESCRIPTION

FIG. 1 to FIG. 4 depict a fabricating method of a warpage-reducing semiconductor structure according to a first preferred embodiment of the present invention.

Figure 1:
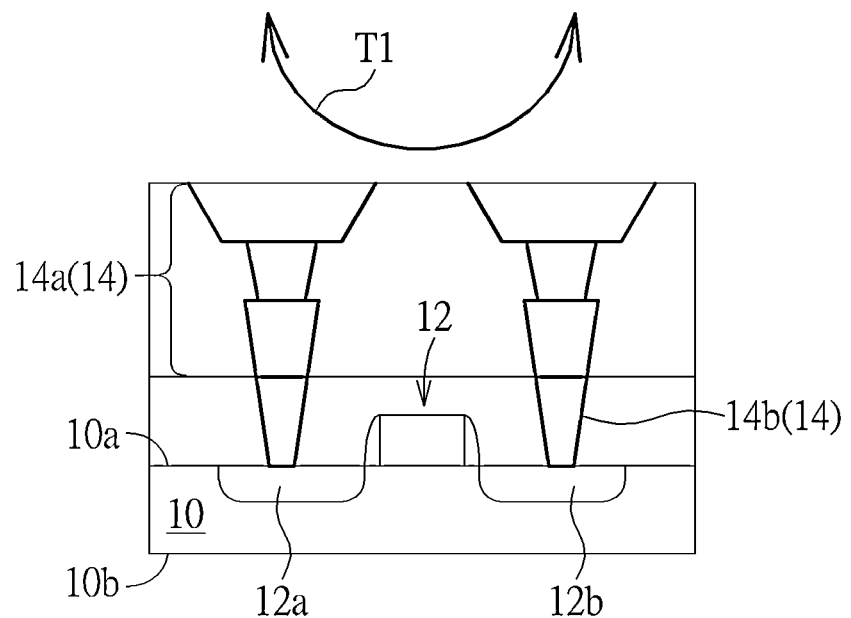

As shown in FIG. 1, a wafer 10 including a front side 10a and a back side 10b is provided. The front side 10a is opposite to the back side 10b. The wafer 10 can be a silicon substrate before dicing, a silicon interposer, a printed circuit board or a die which is diced. The wafer 10 is exemplified as a silicon substrate in this embodiment. Numerous semiconductor elements are disposed at the front side 10a. The semiconductor elements may include at least a transistor 12 and numerous metal lines 14. The transistor 12 and the metal lines 14 are disposed on the wafer 10. The metal lines 14 include back end of lines 14a and front end of lines 14b. The front end of lines 14b contact and electrically connect to the back end of lines 14a. The front end of lines 14b contact and electrically connect to a source 12a and a drain 12b of the transistor 12. Besides, the front end of lines 14b can also connect to other semiconductor elements such as a capacitor, a resistor or a memory cell, not limited to the transistor 12.

Metal lines 14 are formed at the front side 10a of the wafer 10. Furthermore, there are fewer metal lines 14 or there is no metal line 14 disposed at the back side 10b of the wafer 10. Because the back end of lines 14a are usually made of metal layers and a total area of the metal layers in the back end of lines 14a is generally large, a first tensile stress T1 is generated by the metal layers in the back end of lines 14a to bend the wafer 10 toward the front side 10a. However, because there are few metal lines 14 or no metal line 14 disposed on the back side 10b of the wafer 10, the tensile stress at the back side 10b of the wafer 10 is not enough to compensate the first tensile stress T1 at the front side 10a. Therefore, the wafer 10 tends to bend toward the front side 10a. If the tendency is not fixed, warpage will occur in the wafer 10.

Figure 2:
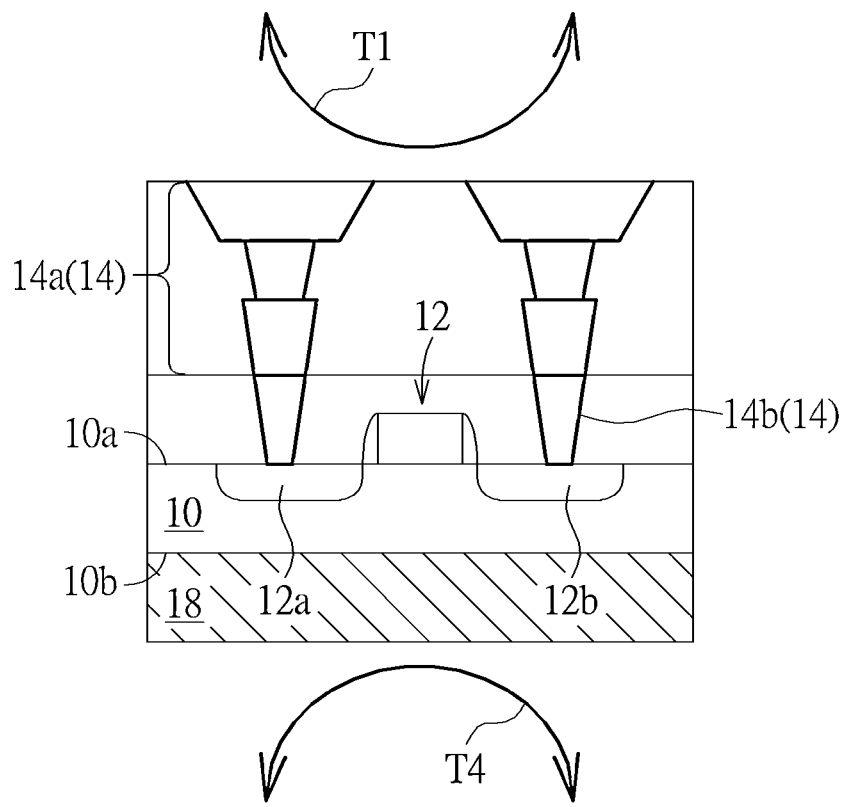

As shown in FIG. 2, a stress layer 18 is disposed at the back side 10b of the wafer 10. The stress layer 18 physically contacts the back side 10b. The stress layer 18 provides a fourth tensile stress T4 to make the wafer 10 bend toward the back side 10b. That is, the stress layer 18 includes the fourth tensile stress T4. The stress layer 18 can be silicon oxide such as tetraethyl orthosilicate (TEOS), silicon oxycarbide (SiCO) or silicon oxynitride (SiON). In other cases, the stress layer 18 can be a material which is not silicon oxide such as nitrogen-doped silicon carbide (SiC:N). According to a preferred embodiment of the present invention, the stress layer 18 is TEOS. The fabricating steps of TEOS are preferably by a plasma enhanced chemical vapor deposition (PECVD) including an operating pressure of 8 torr, an operating temperature between 300 and 400 Celsius degrees. Furthermore, the RF power of the PECVD is 800 W. The precursor of the PECVE includes TEOS. The gas introduced during the PECVD includes oxygen and helium.

Figure 3:
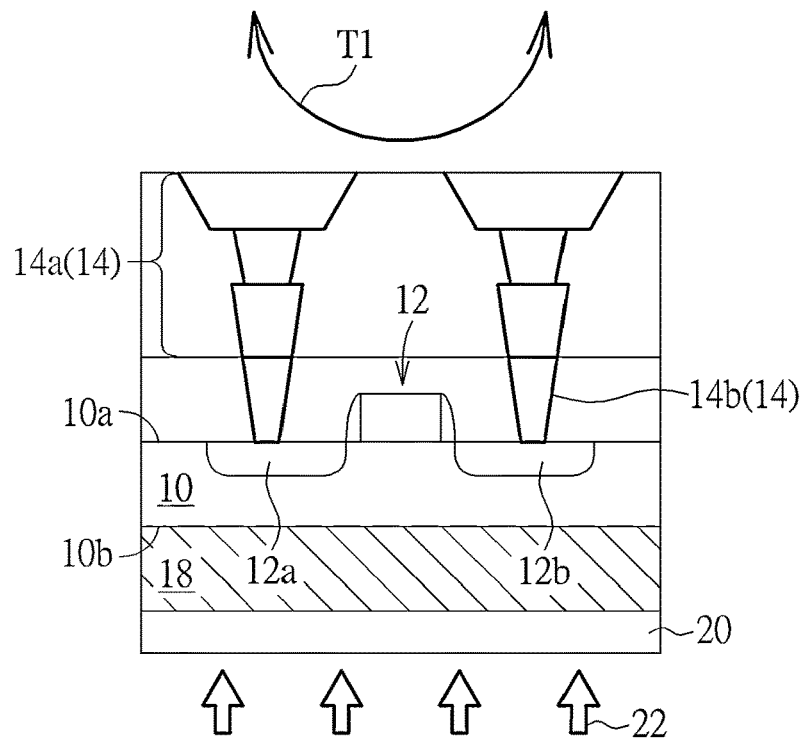
Figure 4:
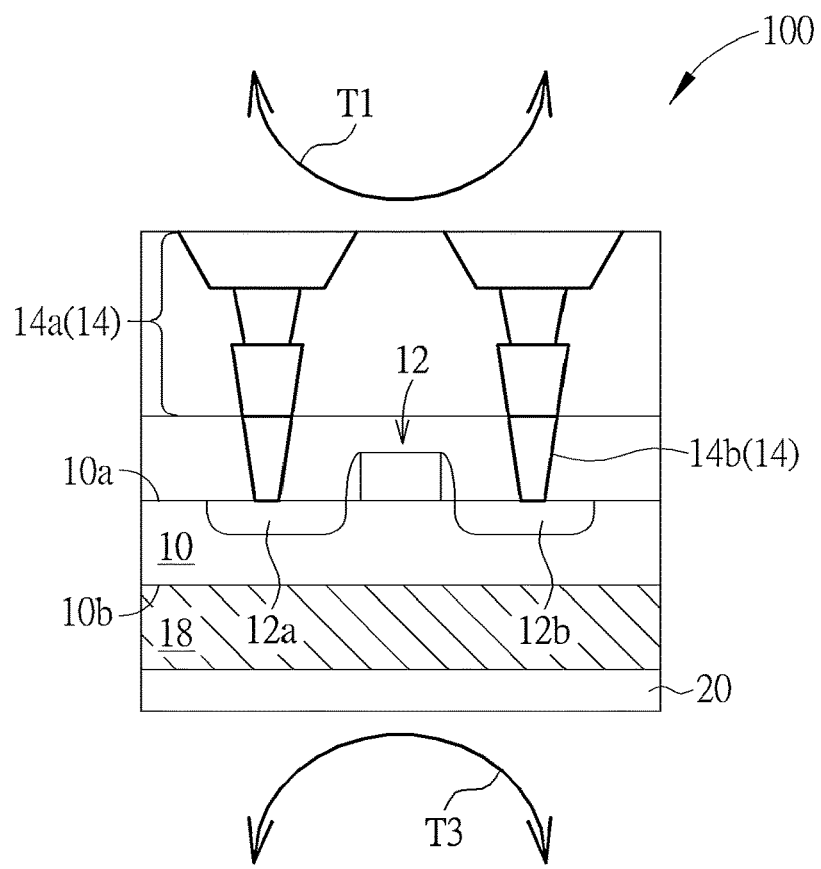

As shown in FIG. 3, a UV-transparent silicon nitride layer 20 is formed to cover and contact the stress layer 18. The refractive index of the UV-transparent silicon nitride layer 20 is between 1.55 and 2.10. Later, a UV light curing process 22 is performed, wherein during the UV light curing process 22, the UV light penetrates the UV-transparent silicon nitride layer 20 to irradiate the stress layer 18. According to a preferred embodiment of the present invention, an operating pressure of the UV light curing process 22 is 6 torr. An operating temperature of the UV light curing process 22 is between 300 and 400 Celsius degrees. The power of the UV light is 600 watt/inch. The gas introduced during of the UV light curing process 22 includes oxygen and helium. The curing time of the UV light curing process 22 is between 10 and 200 seconds. As shown in FIG. 4, by irradiating the stress layer 18 with UV light, impurities in the stress layer 18 can be removed, and dangling bonds in the stress layer 18 can bond. In this way, the tensile stress in the stress layer 18 can be increased from the fourth tensile stress T4 to a third tensile stress T3. The third tensile stress T3 is larger than the fourth tensile stress T4. The third tensile stress T3 can make the wafer 10 bend toward the back side 10b. The UV-transparent silicon nitride layer 20 is used to isolate the stress layer 18 from the environment, and prevent moisture from getting into the stress layer 18. If there is moisture entering the stress layer 18, the tensile stress in the stress layer 18 may decrease, and even be transformed into a compressive stress due to the moisture. Therefore, a silicon nitride layer is needed to isolate the stress layer 18 from the moisture. The UV light curing process 22 is used to tune the tensile stress in the stress layer 18 finely. Therefore, the UV light curing process 22 can be performed optionally. After the UV light curing process 22, the difference between the third tensile stress T3 and the first tensile stress T1 is small enough and therefore the wafer 10 will not bend. Preferably, the third tensile stress T3 is the same as the first tensile stress T1. At this point, a warpage-reducing semiconductor structure 100 of the present invention is completed.

As shown in FIG. 4, a warpage-reducing semiconductor structure 100 which is formed by the fabricating method disclosed in the first preferred embodiment includes a wafer 10. The wafer 10 includes a front side 10a and a back side 10b. The front side 10a is opposite to the back side 10b. The wafer 10 can be a silicon substrate before dicing, a silicon interposer, a printed circuit board or a die which is diced. Numerous semiconductor elements are disposed at the front side 10a. The semiconductor elements may include at least a transistor 12 and numerous metal lines 14 disposed at the front side 10a. A stress layer 18 is disposed at the back side 10b of the wafer 10. The stress layer 18 physically contacts the back side 10b. A UV-transparent silicon nitride layer 20 covers and contacts the stress layer 18, wherein the refractive index of the UV-transparent silicon nitride layer 20 is between 1.55 and 2.10. UV light can penetrate a silicon nitride layer which has the refractive index between 1.55 and 2.10. The thickness of the UV-transparent silicon nitride layer 20 is preferably smaller than 200 angstroms. With the thickness smaller than 200 angstroms, the compressive stress generated in the UV-transparent silicon nitride layer 20 is small, and the compressive stress would not induce the warpage of the wafer 10. The metal lines 14 may be back end of lines 14a. A first tensile stress T1 is formed by the back end of lines 14a to bend the wafer 10 toward the front side 10a. The stress layer 18 provide a third tensile stress T3 to bend the wafer 10 toward the back side 10b. According to a preferred embodiment of the present invention, the first tensile stress T1 is the same as the third tensile stress T3. In this way, the stress bending the wafer 10 toward the front side 10a and the back side 10b can neutralize with each other, and warpage of the wafer 10 will not occurred. The stress layer 18 can be silicon oxide such as tetraethyl TEOS, SiCO or SiON. In other cases, the stress layer 18 can be a material which is not silicon oxide such as SiC:N.

FIG. 5 to FIG. 8 depict a fabricating method of a warpage-reducing semiconductor structure according to a second preferred embodiment of the present invention, wherein elements which are substantially the same as those in the first preferred embodiment are denoted by the same reference numerals; an accompanying explanation is therefore omitted.

Figure 5:
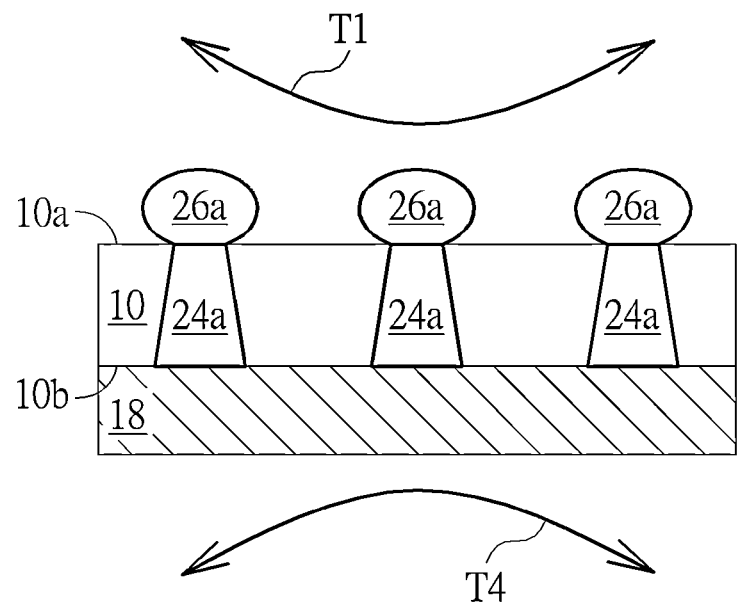

As shown in FIG. 5, a wafer 10 including a front side 10a and a back side 10b is provided. In this embodiment, the wafer 10 is preferably a silicon interposer. The silicon interposer includes numerous through silicon vias 24a. Numerous semiconductor elements are disposed at the front side 10. The semiconductor elements are preferably numerous first input/output (I/O) metal elements 26a. The first I/O metal elements 26a provide a first tensile stress T1 to make the wafer 10 bend toward the front side 10a. Next, a stress layer 18 is disposed at the back side 10b of the wafer 10. The stress layer 18 provides a fourth tensile stress T4 to make the wafer 10 bend toward the back side 10b. Similarly, the stress layer 18 includes TEOS, SiCO, SiON or SiC:N. The fabricating steps of the stress layer 18 are exemplified in the first preferred embodiment, and therefore are omitted here.

Figure 6:
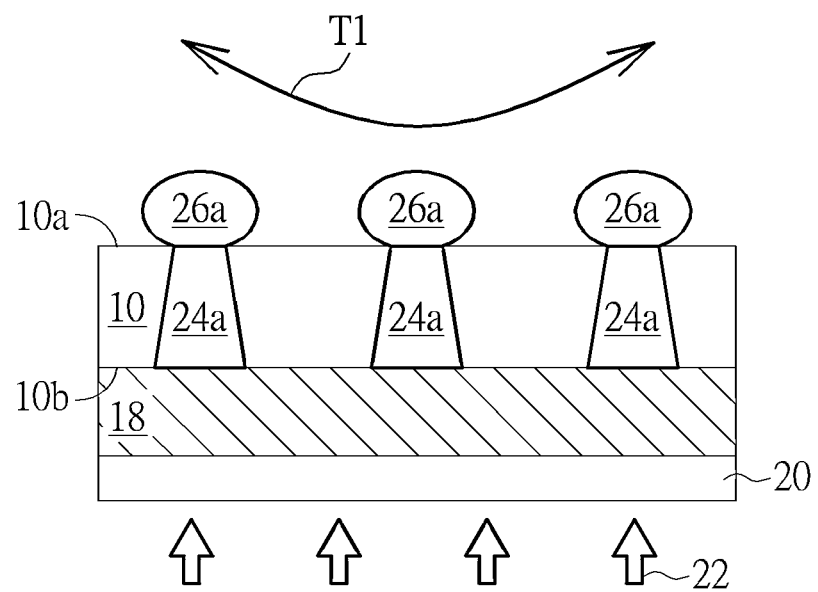
Figure 7:
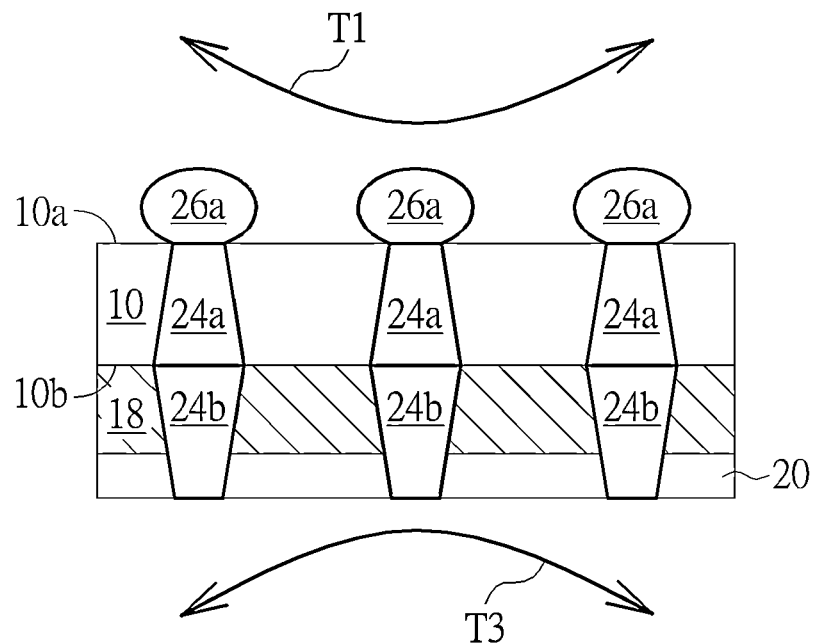

As shown in FIG. 6, a UV-transparent silicon nitride layer 20 is formed to cover and contact the stress layer 18. The refractive index of the UV-transparent silicon nitride layer 20 is between 1.55 and 2.10. Later, a UV light curing process 22 is performed, wherein during the UV light curing process 22, the UV light penetrates the silicon nitride layer 20 to irradiate the stress layer 18. The detailed fabricating steps of UV light curing process 22 are exemplified in the first preferred embodiment, and therefore are omitted here. After the UV light curing process 22, the tensile stress in the stress layer 18 can be increased from the fourth tensile stress T4 to a third tensile stress T3. The third tensile stress T3 make the wafer 10 bend toward the back side 10b.

Figure 8:
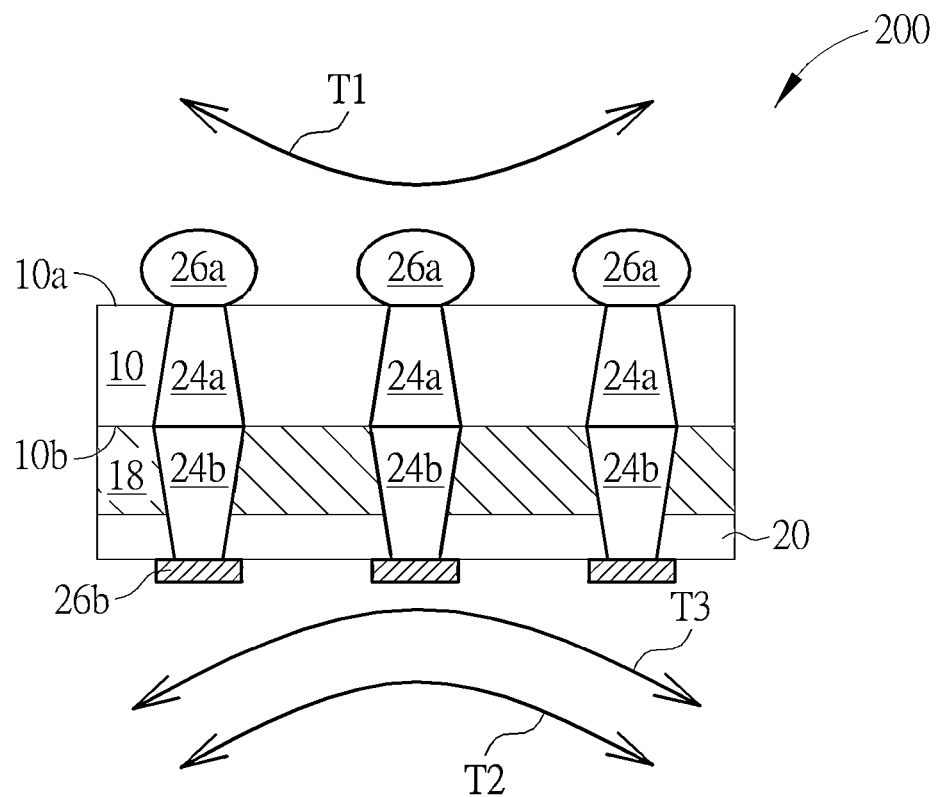

As shown in FIG. 8, when the UV light curing process 22 is completed, numerous through silicon vias 24b are formed within the stress layer 18 and the UV-transparent silicon nitride layer 20. The through silicon vias 24b contact the through silicon vias 24a. After that, numerous second I/O metal elements 26b are formed at the back side 10b of the wafer 10. In detail, the second I/O metal elements 26b directly contact the UV-transparent silicon nitride layer 20 and the through silicon vias 24b. Alternatively, at least one dielectric layer (not shown) can be formed to cover the UV-transparent silicon nitride layer 20, then the through silicon vias 24b can be formed within the stress layer 18, the UV-transparent silicon nitride layer 20, and the dielectric layer. After that, the second I/O metal elements 26b can be formed on the dielectric layer.

Now, a warpage-reducing semiconductor structure 200 of the present invention is completed. The second I/O metal elements 26b provide a second tensile stress T2 to make the wafer 10 bend toward the back side 10b, wherein the second tensile stress T2 is smaller than the first tensile stress T1. A summation of the second tensile stress T2 and the third tensile stress T3 is preferably the same as the first tensile stress T1. In other cases, the difference between the aforesaid summation and the first tensile stress T1 is small enough and therefore the wafer 10 will not bend.

As shown in FIG. 8, a warpage-reducing semiconductor structure 200 which is formed by the fabricating method disclosed in the second preferred embodiment includes a wafer 10. The wafer 10 includes a front side 10a and a back side 10b. The wafer 10 is preferably a silicon interposer. Numerous semiconductor elements are disposed at the front side 10a. A stress layer 18 is disposed at the back side 10b of the wafer 10. The stress layer physically contacts the back side 10b. A UV-transparent silicon nitride layer 20 covers and contacts the stress layer 18, wherein the refractive index of the UV-transparent silicon nitride layer 20 is between 1.55 and 2.10. UV light can penetrate a silicon nitride layer which has the refractive index between 1.55 and 2.10. The stress layer 18 can be TEOS, SiCO, SiON or SiC:N. The semiconductor elements are preferably numerous first I/O metal elements 26a such as numerous bumps. The first I/O metal elements 26a provide a first tensile stress T1 to make the wafer 10 bend toward the front side 10a. Besides bumps, the semiconductor elements can also be redistribution layers or other circuit elements. Numerous second I/O metal elements 26b are disposed at the back side 10b of the wafer 10. The second I/O metal elements 26b can be numerous conductive pads. Based on different requirements, the second I/O metal elements 26b can be replaced by redistribution layers or other circuit elements. The second I/O metal elements 26b provide a second tensile stress T2 to make the wafer 10 bend toward the back side 10b. The second tensile stress T2 is smaller than the first tensile stress T1. A summation of the second tensile stress T2 and the third tensile stress T3 is preferably the same as the first tensile stress T1. In other cases, the difference between the aforesaid summation and the first tensile stress T1 is small enough so that the wafer 10 will not bend.

In the present invention, a stress layer is specially formed at the back side of a wafer to compensate the difference between the stress at the front side and the back side of the wafer. When metal layers per unit area at the front side differs a lot from the metal layers per unit area at the back side, the wafer will bend toward the front side or the back side. By arranging a stress layer at the side which has a smaller stress, the difference between the stresses at the front side and at the back side can be balanced. Therefore, warpage of the wafer can be prevented. In addition, a silicon nitride layer is disposed on the stress layer to keep moisture from entering the stress layer, and stress provided by the stress layer will not alter because of moisture.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A warpage-reducing semiconductor structure, comprising:
   a wafer comprising a front side and a back side;
   a plurality of semiconductor elements disposed at the front side;
   a silicon oxide layer physically contacting the back side; and
   a UV-transparent silicon nitride layer covering and contacting the silicon oxide layer, wherein a refractive index of the UV-transparent silicon nitride layer is between 1.55 and 2.10, and the silicon oxide layer is sandwiched between the back side and the UV-transparent silicon nitride layer.

2. The warpage-reducing semiconductor structure of claim 1, wherein the plurality of semiconductor elements comprises:
   a transistor disposed at the front side of the wafer; and
   a plurality of back end of lines disposed on the transistor, wherein the plurality of back end of lines provide a first tensile stress to make the wafer bend toward the front side, and the silicon oxide layer provides a third tensile stress to make the wafer bend to the back side.

3. The warpage-reducing semiconductor structure of claim 2, wherein the first tensile stress is the same as the third tensile stress.

4. The warpage-reducing semiconductor structure of claim 1, wherein the plurality of semiconductor elements comprises:
   a plurality of first input/output (I/O) metal elements disposed at the front side, and the plurality of first I/O metal elements provide a first tensile stress to make the wafer bend toward the front side.

5. The warpage-reducing semiconductor structure of claim 4, further comprising:
   a plurality of second I/O metal elements disposed at the back side, the plurality of second I/O metal elements providing a second tensile stress to make the wafer bend toward the back side, wherein the second tensile stress is smaller than the first tensile stress, the silicon oxide layer and the UV-transparent silicon nitride layer are disposed between the plurality of second I/O metal elements and the back side, and the silicon oxide layer provides a third tensile stress to make the wafer bend to the back side.

6. The warpage-reducing semiconductor structure of claim 5, wherein the first tensile stress is the same as a summation of the second tensile stress and the third tensile stress.

7. The warpage-reducing semiconductor structure of claim 1, wherein the silicon oxide layer comprises tetraethyl orthosilicate (TEOS), silicon oxycarbide (SiCO) or silicon oxynitride (SiON).

8. A warpage-reducing semiconductor structure, comprising:
   a wafer comprising a front side and a back side;
   a plurality of metal lines disposed at the front side;
   a stress layer physically contacting the back side, wherein the stress layer comprises tetraethyl orthosilicate (TEOS), nitrogen-doped silicon carbide (SiC:N), silicon oxycarbide (SiCO) or silicon oxynitride (SiON); and
   a silicon nitride layer covering the stress layer, wherein the stress layer is sandwiched between the back side and the silicon nitride layer.

9. The warpage-reducing semiconductor structure of claim 8, wherein the plurality of metal lines comprising a plurality of back end of lines, the plurality of back end of lines provide a first tensile stress to make the wafer bend toward the front side, and the stress layer provides a third tensile stress to make the wafer bend to the back side.

10. The warpage-reducing semiconductor structure of claim 9, wherein the first tensile stress is the same as the third tensile stress.

11. The warpage-reducing semiconductor structure of claim 8, wherein the metal lines comprises:
a plurality of first input/output (I/O) metal elements disposed at the front side, and the plurality of first I/O metal elements provide a first tensile stress to make the wafer bend toward the front side.

12. The warpage-reducing semiconductor structure of claim 11, further comprising:
a plurality of second I/O metal elements disposed at the back side, wherein the plurality of second I/O metal elements provide a second tensile stress to make the wafer bend toward the back side, the second tensile stress is smaller than the first tensile stress, the stress layer is disposed between the plurality of second I/O metal elements and the back side, and the stress layer provides a third tensile stress to make the wafer bend toward the back side.

13. The warpage-reducing semiconductor structure of claim 12, wherein the first tensile stress is the same as a summation of the second tensile stress and the third tensile stress.

14. A fabricating method of a warpage-reducing semiconductor structure, comprising:
providing a wafer comprising a front side and a back side, wherein a plurality of semiconductor elements are disposed at the front side;
forming a silicon oxide layer physically contacting the back side;
forming a silicon nitride layer covering and contacting the silicon oxide layer, wherein the silicon oxide layer is sandwiched between the back side and the silicon nitride layer; and
performing a UV light curing process, wherein during the UV light curing process, the UV light penetrates the silicon nitride layer to irradiate the silicon oxide layer.

15. The fabricating method of a warpage-reducing semiconductor structure of claim 14, wherein the silicon nitride layer is a UV-transparent silicon nitride layer, wherein a refractive index of the silicon nitride layer is between 1.55 and 2.10.

16. The fabricating method of a warpage-reducing semiconductor structure of claim 14, wherein the plurality of semiconductor elements comprises:
a transistor disposed at the front side of the wafer; and
a plurality of back end of lines disposed on the transistor, wherein the plurality of back end of lines provide a first tensile stress to make the wafer bend toward the front side, and the silicon oxide layer provides a third tensile stress to make the wafer bend to the back side.

17. The fabricating method of a warpage-reducing semiconductor structure of claim 16, wherein the first tensile stress is the same as the third tensile stress.

18. The fabricating method of a warpage-reducing semiconductor structure of claim 14, wherein the silicon oxide layer comprises tetraethyl orthosilicate (TEOS), silicon oxycarbide (SiCO) or silicon oxynitride (SiON).

19. The fabricating method of a warpage-reducing semiconductor structure of claim 14, wherein the plurality of semiconductor elements comprises:
a plurality of first I/O metal elements disposed at the front side, and the plurality of first I/O metal elements providing a first tensile stress to make the wafer bend toward the front side.

20. The fabricating method of a warpage-reducing semiconductor structure of claim 19, further comprising:
a plurality of second I/O metal elements disposed at the back side, the plurality of second I/O metal elements providing a second tensile stress to make the wafer bend toward the back side, wherein the second tensile stress is smaller than the first tensile stress, the silicon oxide layer and the silicon nitride layer are disposed between the plurality of second I/O metal elements and the back side, and the silicon oxide layer provides a third tensile stress to make the wafer bend to the back side.

* * * * *